United States Patent
Yavuz et al.

(10) Patent No.: US 8,203,961 B2
(45) Date of Patent: Jun. 19, 2012

(54) METHODS AND APPARATUS FOR PROVIDING MODIFIED TIMESTAMPS IN A COMMUNICATION SYSTEM

(75) Inventors: Mehmet Yavuz, San Diego, CA (US);
Matthew S. Grob, La Jolla, CA (US);
Peter J. Black, San Diego, CA (US);
Rohit Kapoor, San Diego, CA (US);
Serafin Diaz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 55 days.

(21) Appl. No.: 12/189,547

(22) Filed: Aug. 11, 2008

(65) Prior Publication Data

US 2010/0034212 A1  Feb. 11, 2010

(51) Int. Cl.
*G01R 31/08* (2006.01)
*H04L 12/66* (2006.01)
(52) U.S. Cl. .................. 370/252; 370/232; 370/352
(58) Field of Classification Search .................. 370/252, 370/516, 468, 418, 325, 395.1, 412, 465, 370/503, 517
See application file for complete search history.

(56) References Cited

U.S. PATENT DOCUMENTS

| | | | | |
|---|---|---|---|---|
| 4,538,259 | A * | 8/1985 | Moore | 370/394 |
| 5,640,388 | A * | 6/1997 | Woodhead et al. | 370/468 |
| 6,259,677 | B1 | 7/2001 | Jain | |
| 6,574,246 | B1 * | 6/2003 | Crosby | 370/516 |
| 7,257,087 | B2 | 8/2007 | Grovenburg | |
| 7,506,023 | B2 * | 3/2009 | Keohane et al. | 709/203 |
| 7,675,946 | B2 | 3/2010 | Dhanapal et al. | |

OTHER PUBLICATIONS

International Search Report—PCT/US2008/084241—International Search Authority, European Patent Office, Apr. 23, 2009.
Ramjee R et al: "Adaptive playout mechanisms for packetized audio applications in wide-area networks" INFOCOM 94. Networking for Global Communications., 13th Proceedings I EEE Toronto, Ont., Canada Jun. 12-16, 1994, Los Alamitos, CA, USA,IEEE Comput. Soc, Jun. 12, 1994, pp. 680-688, XP010098440 ISBN; 978-0-818.
Shallwani A et al: "An adaptive playout algorithm with delay spike detection for real-time VoIP" CCECE 2003. Canadian Conference on Electrical and Computer Engineering . Montreal, Canada, May 4-7, 2003; [Canadian Conference on Electrical and Computer Engineering], New York, NY : IEEE, US, vol. 2, May 4, 2003, pp. 997-1000, XP010654239 ISBN: 978-0-7803-7781-3 p. 2-p. 3.
Written Opinion—PCT/US2008/084241—International Search Authority European Patent Office—Apr. 23, 2009.

* cited by examiner

*Primary Examiner* — Seema S Rao
*Assistant Examiner* — Samina Choudhry
(74) *Attorney, Agent, or Firm* — Kim Tam; Espartaco Diaz Hidalgo

(57) ABSTRACT

Methods and apparatus for providing modified timestamps in a communication system. In an aspect, a method includes receiving one or more packets associated with a selected destination, computing an average relative delay associated with each packet, determining a modified timestamp associated with each packet based on the average relative delay associated with each packet, and outputting the one or more packets and their associated modified timestamps. In an aspect, an apparatus is provided for generating modified timestamps. The apparatus includes a packet receiver configured to receive one or more packets associated with a selected destination and processing logic configured to compute an average relative delay associated with each packet, determine a modified timestamp associated with each packet based on the average relative delay associated with each packet, and output the one or more packets and their associated modified timestamps.

25 Claims, 4 Drawing Sheets

METHODS AND APPARATUS FOR PROVIDING MODIFIED TIMESTAMPS IN A COMMUNICATION SYSTEM

BACKGROUND

1. Field

The present application relates generally to the operation of wireless communication devices, and more particularly, to methods and apparatus for providing modified time stamps in a communication system.

2. Background

In time delay sensitive applications, such as Voice over Internet Protocol (VoIP), traffic packets typically are generated at a source terminal with regular time intervals (e.g., 20 ms). However, these packets may not arrive at the destination terminal with uniform time intervals. For example, in a mobile to mobile voice call, traffic packets first travel over a reverse link (RL) from the source, then over a core network, and then arrive at a destination radio access network (RAN). Packets usually do not arrive at the destination RAN with uniform time intervals due to one or more jitter sources. For example, traversing a core VoIP network may introduce delay jitter. In a packet switched network, additional delay jitter occurs due to queuing and transmission on the forward link to a destination device. Typically a de-jitter buffer provided at a receiving device observes a combination of these multiple jitter effects.

One technique to reduce the end-to-end jitter is to associate each packet at its source with a real-time timestamp. At the destination, a forward link scheduler uses this timestamp to identify packets that have experienced a long delay so they can be scheduled sooner than packets having a shorter delay. In this way, those packets having experienced a longer delay would experience a relatively short delay on the forward link to compensate for the long delay that has been experienced up to the scheduler.

Notwithstanding, there are several problems associated with the use of real-time timestamps for scheduling packets at the forward link scheduler. First, timing logic at the source needs to be synchronized with the timing logic at the scheduler in order to accurately determine packet delay. While this may be possible using a global timing standard, such as GPS, for mobile to mobile calls, it may not be possible for VoIP calls using land-line VoIP phones, or with mobile VoIP terminals that do not utilize GPS. Second, if the forward link scheduler schedules packets using absolute real-time timestamps associated with source terminals, higher priority will be given to calls which experience long delays. For example, long distance VoIP calls will get higher priority than local VoIP calls. Thus, even local calls may experience long scheduling delays and therefore provide an unsatisfactory user experience.

Therefore, what is needed is a mechanism that operates to reduce the end-to-end jitter in a communication network thereby enabling smaller de-jitter buffers at a receiving device while providing a satisfactory user experience.

SUMMARY

In one or more aspects, a timing system, comprising methods and apparatus, is provided that operates to provide modified timestamps in a communication network. In various aspects, the timing system operates to associate modified timestamps with received packets so that the packets can be scheduled for delivery in an efficient manner without favoring long distance traffic over local traffic. The timing system operates to reduce the end-to-end jitter for each user so that a small de-jitter buffer may be used at a receiving device thereby providing an enhanced user experience.

In an aspect, a method is provided for generating modified timestamps. The method comprises receiving one or more packets associated with a selected destination, computing an average relative delay associated with each packet, determining a modified timestamp associated with each packet based on the average relative delay associated with each packet, and outputting the one or more packets and their associated modified timestamps.

In an aspect, an apparatus is provided for generating modified timestamps. The apparatus comprises a packet receiver configured to receive one or more packets associated with a selected destination and processing logic configured to compute an average relative delay associated with each packet, determine a modified timestamp associated with each packet based on the average relative delay associated with each packet, and output the one or more packets and their associated modified timestamps.

In an aspect, an apparatus is provided for generating modified timestamps. The apparatus comprises means for receiving one or more packets associated with a selected destination, means for computing an average relative delay associated with each packet, means for determining a modified timestamp associated with each packet based on the average relative delay associated with each packet, and means for outputting the one or more packets and their associated modified timestamps.

In an aspect, a computer program product is provided for generating modified time stamps. The computer program product comprises a machine-readable medium that comprises a first set of codes for causing a computer to receive one or more packets associated with a selected destination and a second set of codes for causing the computer to compute an average relative delay associated with each packet. The machine-readable medium also comprises a third set of codes for causing the computer to determine a modified timestamp associated with each packet based on the average relative delay associated with each packet and a fourth set of codes for causing the computer to output the one or more packets and their associated modified timestamps.

In an aspect, at least one integrated circuit is provided that is configured to generate modified time stamps. The at least one integrated circuit comprises a first module configured to receive one or more packets associated with a selected destination, a second module configured to compute an average relative delay associated with each packet, a third module configured to determine a modified timestamp associated with each packet based on the average relative delay associated with each packet, and a fourth module configured to output the one or more packets and their associated modified timestamps.

Other aspects will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DESCRIPTION

In various aspects, a timing system is provided that operates to provide modified timestamps in a communication network thereby reducing end-to-end jitter and allowing a small de-jitter buffer to be used at a receiving device to provide an enhanced user experience.

Figure 1:
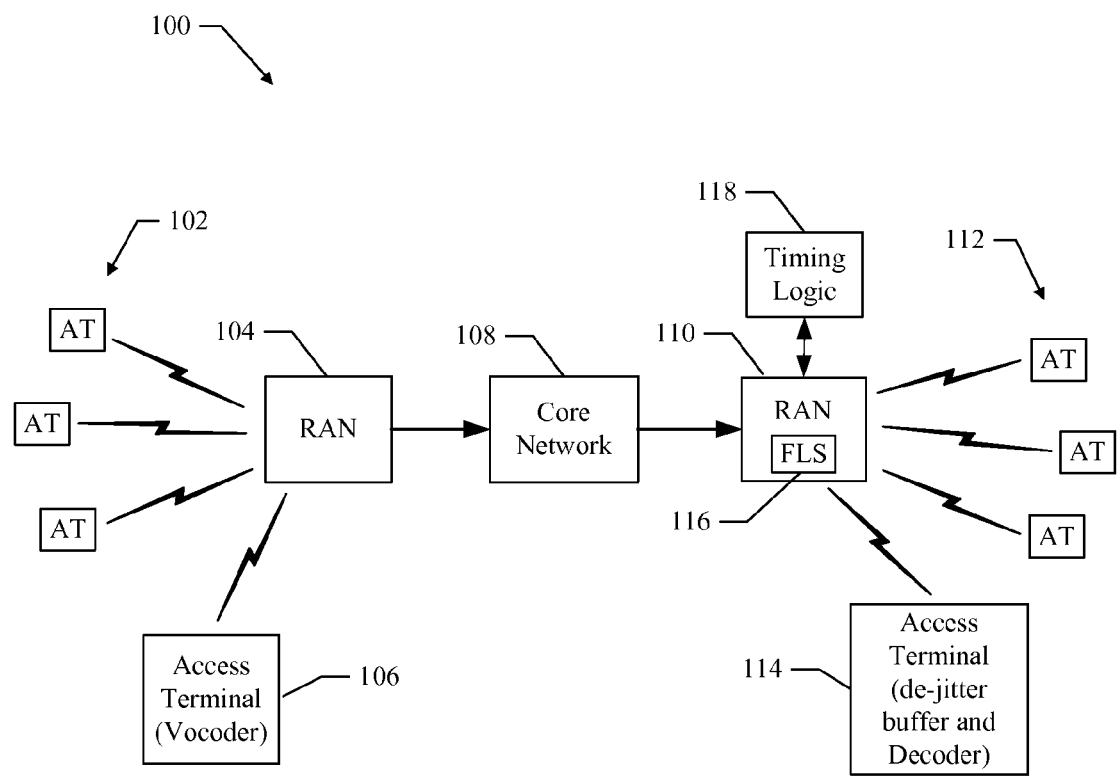
FIG. 1 shows a communication network that illustrates aspects of a timing system.

FIG. 1 shows a communication network that illustrates aspects of a timing system. The communication network 100 comprises a first set of access terminals (ATs) 102 that are operable to communicate with a first Random Access Network (RAN) 104. For example, the operation of the ATs 102 will be described herein with reference to AT 106. Packets generated by a Vocoder are time-stamped at the AT 106 and transmitted to the RAN 104 and further carried over a core network 108. For example, the core network 108 may be a Voice over IP network. A second RAN 110 receives the packets from the core network 108 and schedules their delivery to a second set of ATs 110.

The RAN 102, core network 108, and RAN 110 comprise any type of wireless and/or wired communication network and cover any desired geographic region. The RAN 102, core network 108, and RAN 110 may communicate with ATs within their geographic region using any suitable type of communication technique or technology.

The RAN 110 includes a forward link scheduler (FLS) 116 that operates to schedule packets for delivery to the ATs 114 based on their associated timestamps. Typically, as packets are received from the core network, timestamps associated with those packets are used to determine the order in which the packets are scheduled. Thus, packets from distance users which have experienced the most delay may be scheduled ahead of packets associated with local users which have most likely experienced smaller delays. However, such a scheduling technique may result in undesirable effects experienced by the destination ATs 112. Thus, in various aspects, the timing system operates to provide modified timestamps as described below to overcome these undesirable effects.

For this description, the operation of the ATs 112 is described herein with reference to the AT 114. The AT 114 comprises a de-jitter buffer that operates to buffer received packets so as to compensate for varying time delays experienced by the packets as they are transmitted over the various network transmission paths. Once the jitter is compensated for, the packets are processed by a decoder at the AT 114 so that transmitted information can be recovered for presentation to a device user. If the jitter experienced by the received packets is very large, then the de-jitter buffer may also need to be correspondingly large. Furthermore, even though the de-jitter buffer is able to compensate for the time delays experienced by the received packets, the device user may experience an overall time delay or lag that makes for an unsatisfactory user experience. For example, if the packets are related to a voice call, the user of the device 114 may experience significant delay when listening to the received voice information thereby making a conversation with a distance user difficult to conduct.

In various aspects, timing logic 118 is provided that operates to provide modified timestamps to allow the FLS 116 at the RAN 110 to schedule the packets for delivery to the second set of ATs 112 so that end-to-end jitter can be reduced or minimized. For example, in an aspect, the timing logic 118 operates to provide modified timestamps associated with packets received at the RAN 110 according to a timestamp algorithm. When the modified timestamps are processed by the FLS 116, packets are scheduled so as to reduce end-to-end jitter for each user. In an aspect, the timestamp algorithm operates to determine an average of the delay up to the destination RAN experienced by packets associated with a particular flow and uses this average to determine the modified timestamps. A more detailed description of the operation of the timing logic 118 is provided in other sections of this document.

In various aspects, the timing logic 118 operates to perform one or more of the following functions to determine modified timestamps for packets received from a particular source and destined for a particular destination AT.

1. Receive a first packet of a flow having a source timestamp.
2. Determine a delay experienced by the packet.
3. Determine a modified timestamp for the first packet based on the delay experienced by the packet up to the destination RAN.
4. Receive additional packets.
5. Maintain an average relative delay experienced by the packets based on the timestamp associated with each received packet.
6. Determine a modified time stamp for each received packet based on the average relative delay experienced by packets.

Therefore, in various aspects, the timing system operates to initialize and maintain an average relative delay experienced by packets up to the destination RAN, which is determined from timestamps associated with each received packet. This average relative delay is then used to determine modified time stamps to be associated with each received packet.

Figure 2:
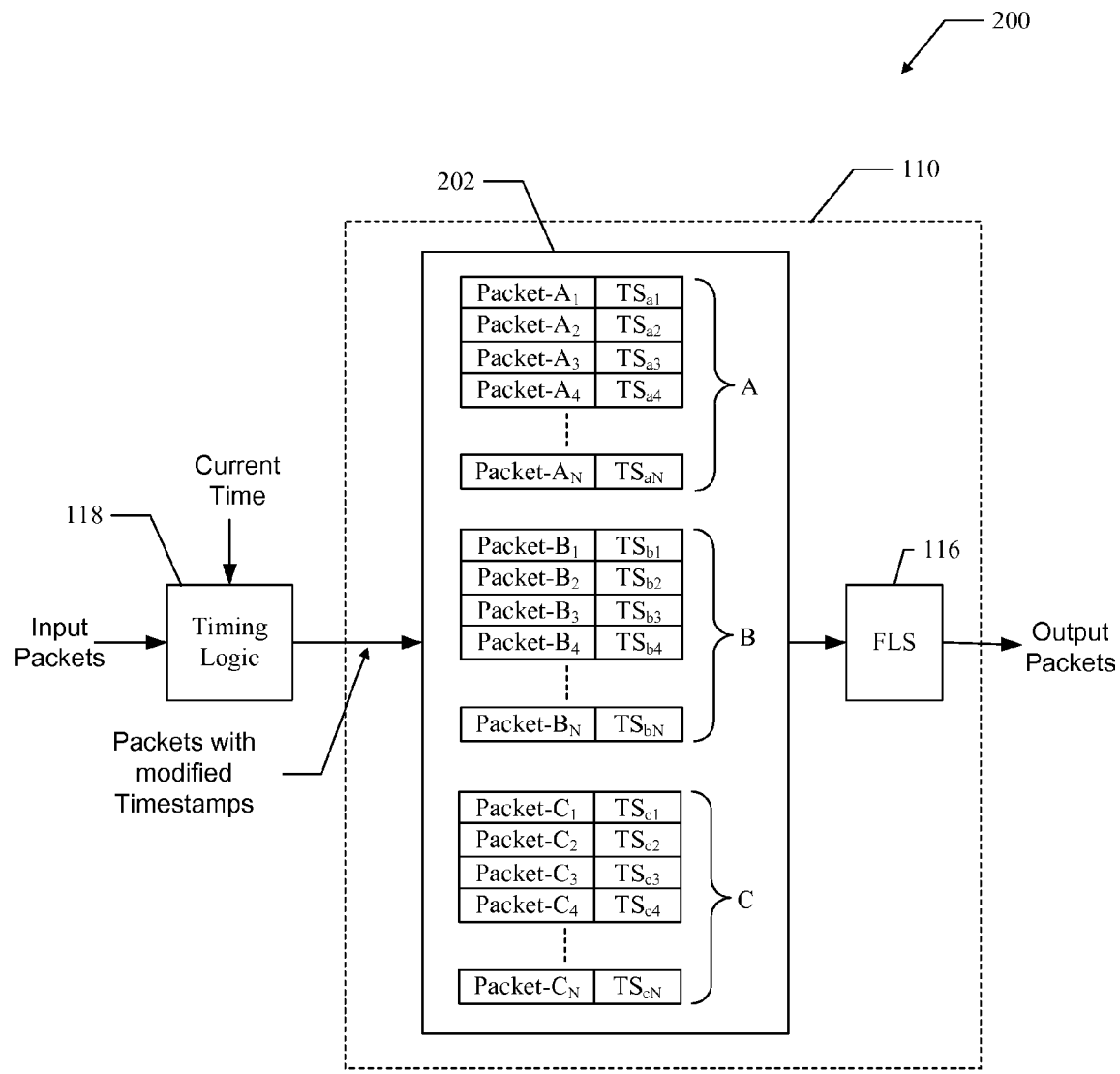
FIG. 2 shows a diagram that illustrates the operation of aspects of a timing system.

FIG. 2 shows a simplified architectural design 200 that illustrates the operation of aspects of a timing system. The design 200 illustrates how the timing logic 118 operates to provide modified timestamps for use in aspects of a timing system. The design 200 shows the RAN 110, the timing logic 118 and the FLS 116.

During operation of the timing system, packets are received by the timing logic 118. The packets may be associated with a number of different users and are transmitted to the RAN 110 for distribution to destination ATs. The timing logic 118 operates to generate modified timestamps according to a timing algorithm discussed in detail below. For example, a delay experienced up to the destination RAN is determined for each packet based on the current time and a source timestamp associated with each packet. The source timestamp may be carried as part of a Real Time Protocol (RTP) header. Modified timestamps are generated by a timestamp algorithm from the delay experienced by the packets. Packets with modified timestamps are then placed in a queue 202. The queue 202 shows packets associated with three destinations (A, B, and C). As the packets are placed in the queue 202, the FLS 116 operates to schedule the delivery of the packets to the destination ATs based on the modified timestamps. Thus, the modified timestamps allow the packets to be scheduled for delivery so that the end-to-end jitter associated with packets for each flow is reduced or minimized.

Figure 3:
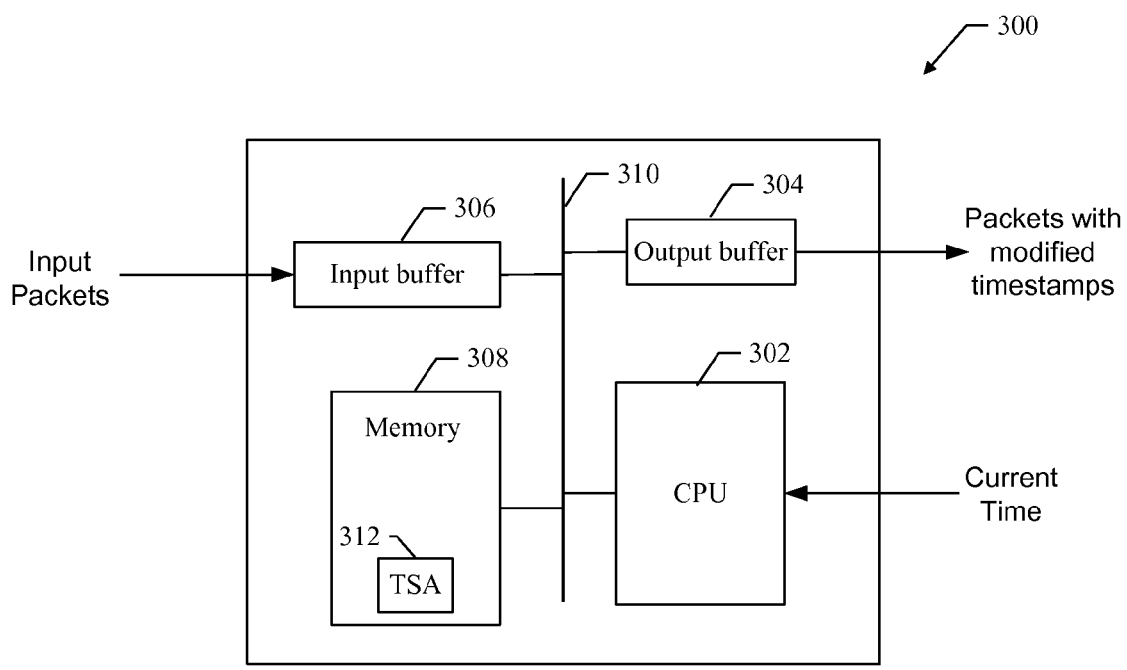
FIG. 3 shows exemplary timing logic for use in aspects of a timing system.

FIG. 3 shows an exemplary hardware configuration of a timing logic 300 for use in aspects of a timing system. For example, the timing logic 300 is suitable for use as the timing logic 118 shown in FIG. 2. The timing logic 300 comprises a central processing unit (CPU) 302, output buffer 304, input buffer 306, and memory 308, which are coupled to a data bus 310.

The input buffer 306 operates to receive packets from a core network for distribution to destination ATs. In an aspect, each received packet has an associated source timestamp, which is associated with each packet at its respective source. The input buffer 306 operates to pass received packets to the CPU 302. The input buffer 306 may also store received packets in the memory 308 for processing.

The memory 308 comprises any suitable storage medium, such as RAM, EPROM, Flash memory, floppy disk, hard disk, optical disk or any other suitable memory device. The memory 308 is operable to store received packets and to store instructions for a timestamp algorithm (TSA) 312. The instructions of the TSA 312 are retrievable by the CPU 302 for execution.

The CPU 302 comprises at least one of discrete logic, hardware, a gate array, memory elements, and integrate circuits or any combination thereof. The CPU 302 operates to execute program instructions of the TSA 312 to perform the functions described herein. For example, the instructions of the TSA 312 are stored in the memory 308 and are retrieved and executed by the CPU 302 to perform the functions described herein. In an aspect, the TSA instructions 312 cause the CPU 302 to obtain the current time and a source timestamp associated with each received packet to determine an average relative delay experienced by packets of a flow. The CPU 302 executes the TSA instructions 312 to determine a modified timestamp to be associated with each packet based on the average relative delay. The CPU 302 then passes packets with modified timestamps to the output buffer 304. A more detailed description of the functions provided by the TSA 312 which will be described later.

The output buffer 304 operates to receive packets with modified time stamps from the CPU 302 and output these packets to selected destinations. For example, the packets may be output to the destination RAN 110 where they are placed in the queue 202 until they are scheduled for delivery by the FLS 116.

In an aspect, the timing system comprises a computer program product having one or more program instructions ("instructions") or sets of "codes" stored or embodied on a machine-readable medium. When the codes are executed by at least one processor, for instance, the CPU 302, their execution causes the CPU to provide the functions of the timing system described herein. For example, the machine-readable medium comprises a floppy disk, CDROM, memory card, FLASH memory device, RAM, ROM, or any other type of memory device or machine-readable medium that interfaces to the timing logic 300. In another aspect, the sets of codes may be downloaded into the timing logic 300 from an external device or communication network resource. The sets of codes, when executed, cause the timing logic 300 to provide aspects of a timing system as described herein.

Figure 4:
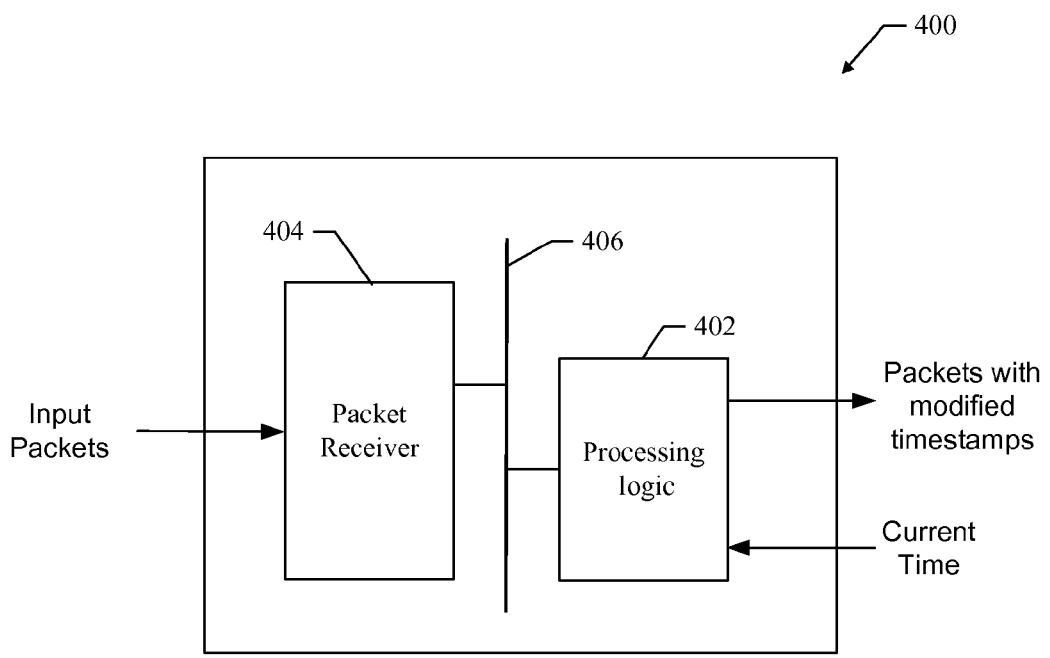
FIG. 4 shows an alternate embodiment of exemplary timing logic for use in aspects of a timing system.

FIG. 4 shows an alternate hardware arrangement of an exemplary timing logic 400 for use in aspects of a timing system. For example, the timing logic 400 is suitable for use as the timing logic 118 shown in FIG. 2. The timing logic 400 comprises processing logic 402 and packet receiver 404, which are coupled to a data bus 406.

The packet receiver 404 comprises at least one of a CPU, processor, gate array, hardware logic, memory elements, and/or hardware executing software. The packet receiver 404 operates to receive packets from a core network for distribution to destination ATs. In an aspect, each received packet has an associated source timestamp, which is associated with each packet at its respective source. The packet receiver 404 operates to pass received packets to the processing logic 402.

The processing logic 402 comprises at least one of a CPU, processor, gate array, hardware logic, memory elements, and/or hardware executing software. In an aspect, the processing logic 402 operates to receive packets from the packet receiver 404 and generate modified timestamps that are associated with the received packets. In an aspect, the processing logic 402 operates to perform a timestamp algorithm to generate the modified timestamps. The algorithm uses the current time and the source timestamp associated with each packet to determine an average relative delay experienced by packets of a flow. The average relative delay is used to determine a modified timestamp to be associated with each packet. Packets with modified timestamps are then output from the processing logic 402. For example, the packets may be output to the destination RAN 110 where they are placed in the queue 202 until they are scheduled for delivery by the FLS 116.

In an aspect, the timing system comprises a computer program product having one or more program instructions ("instructions") or sets of "codes" stored or embodied on a machine-readable medium. When the codes are executed by at least one processor, for instance, a processor at the processing logic 402, their execution causes the processor to provide the functions of the timing system described herein. For example, the machine-readable medium comprises a floppy disk, CDROM, memory card, FLASH memory device, RAM, ROM, or any other type of memory device or machine-readable medium that interfaces to the timing logic 400. In another aspect, the sets of codes may be downloaded into the timing logic 400 from an external device or communication network resource. The sets of codes, when executed, cause the timing logic 400 to provide aspects of a timing system as described herein.

Timestamp Algorithm

In various aspects, the timing system operates to perform a timestamp algorithm that is used to determine modified timestamps to be associated with received packets. Instead of attempting to equalize average end-to-end delay among all users (independent of their different delay values that they experience prior to forward link scheduling), the modified timestamps allow a forward link scheduler to minimize the end-to-end delay jitter for each user such that a de-jitter buffer at a device can operate at a lower delay target. Hence lower mouth-to-ear delay can be achieved and the size of the de-jitter buffer may be smaller. In various aspects, the algorithm performs one or more of the following functions.

1. For each packet associated with a particular destination that is received by the timing logic 300, the following variables are determined.
   a. $RTP\_TS_n$: This is a real-time protocol timestamp associated with packet n. In an aspect, the RTP timestamp is converted to corresponding units of transmission time slots depending on the clock rate used.
   b. $Arrival\_TS_n$: Current time of arrival associated with packet n (in units of slots).
   c. $BD_n$: Averaged relative delay experienced by a packet up to a destination RAN for packet n.
   d. $Modified\_TS_n$: A modified timestamp to be associated with packet n for use by forward link scheduling logic (in units of slots).

2. Initialize the variables $BD_1$ and $Modified\_TS_1$ for the first received packet of a flow destined for a particular AT as follows.
   a. $BD_1 = Arrival\_TS_1 - RTP\_TS_1$
   b. $Modified\_TS_1 = Arrival\_TS_1$ 3. For subsequent packets (n>=2) associated with each flow, determine the variables $BD_n$ and $Modified\_TS_n$ as follows.
   a. $BD_n = ((TC-1)/TC)*BD_{n-1} + (1/TC)(Arrival\_TS_n - RTP\_TS_n)$
   b. $Modified\_TS_n = RTP\_TS_n + BD_n$ In the above algorithm, the average relative delay experienced by a packet up to a destination RAN ($BD_n$) is computed using an IIR filter and only one previous relative delay value. However, in various aspects, the average relative delay experienced by a packet up to the destination RAN ($BD_n$) may be computed using any desirable filtering technique and using any number of previous delay values.

It should also be noted that during operation, the algorithm may determine the $Modified\_TS_n$ to indicate a value later in time than the $Arrival\_TS_n$. In other words, a forward link queuing delay (FLQD) associated with a packet may be negative. In this case, the algorithm treats the packet as if it had a minimum FLQD value (FLQD_minimum). In an aspect, the following operations are performed.

If ($Modified\_{TSn}$ > Current time);

then $Modified\_TS_n$ = Current time − FLQD_minimum

Figure 5:
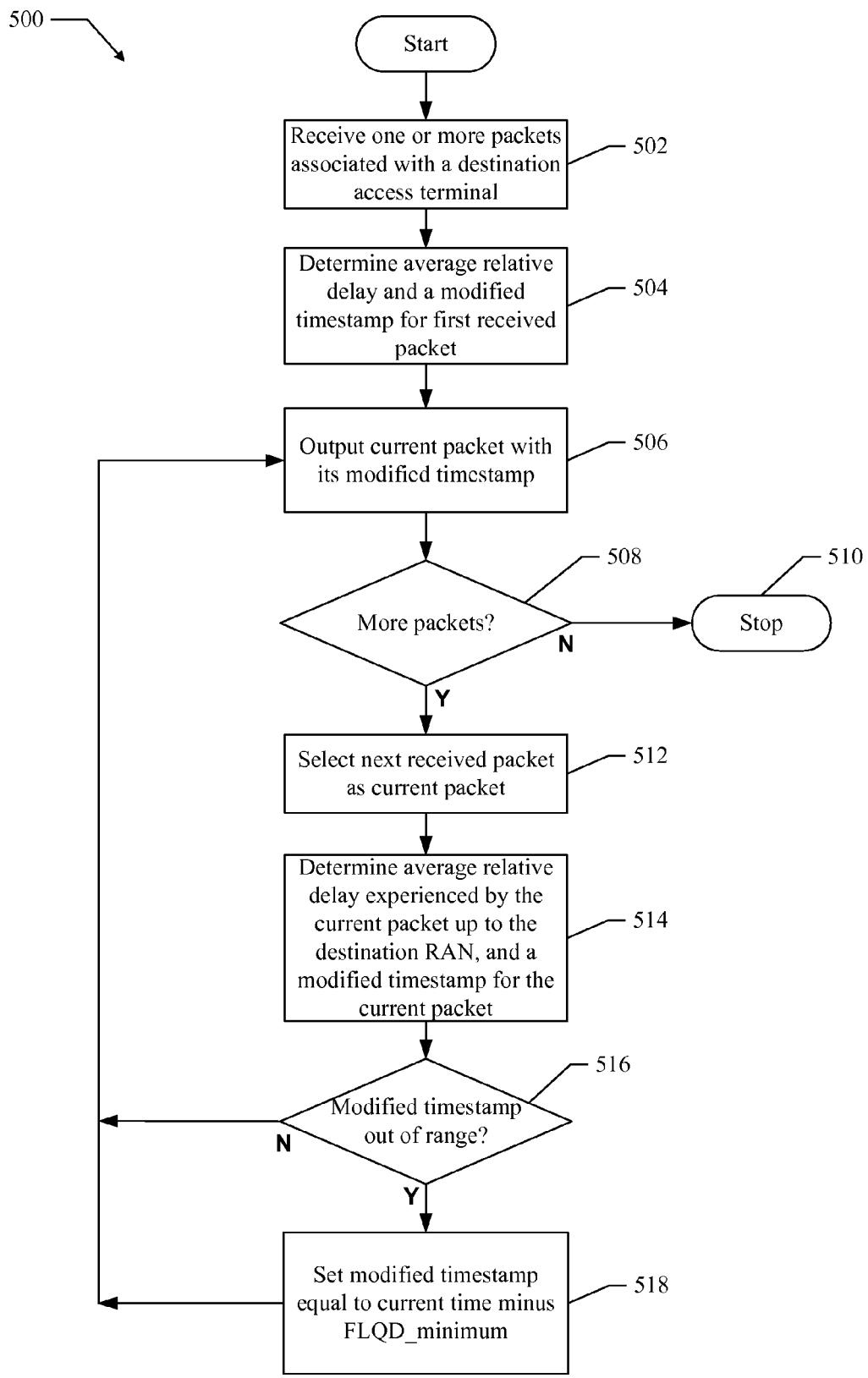
FIG. 5 shows an exemplary method for use in aspects of a timing system.

FIG. 5 shows an exemplary method 500 for generating modified timestamps for received packets provided by aspects of a timing system. For clarity, the method 500 is described below with reference to the timing logic 300 shown in FIG. 3. In an aspect, the CPU 302 executes one or more sets of codes to control the timing logic 300 to perform the functions described below. It should be noted that with minor modifications the method 500 may also be performed by the timing logic 400 shown in FIG. 4.

At block 502, one or more packets associated with a destination access terminal are received. For example, a source access terminal may transmit one or more packets associated with a voice call to a destination access terminal. In an aspect, the one or more packets are received by the input buffer 306. Each received packet has a source timestamp.

At block 504, an average relative delay ($BD_1$) up to a destination RAN, and a modified timestamp for the first received packet (i.e., current packet) are determined. In an aspect, the CPU 302 operates to execute the instructions of the TSA 312 to determine the average relative delay and modified timestamp for the first received packet according to the timestamp algorithm described above.

At block 506, the current packet and its associated modified timestamp are output. In an aspect, the CPU 302 passes the current packet and its associated modified timestamp to the output buffer 304, which in turn, outputs the packet and its modified time stamp to a destination RAN where it is entered into a queue and thereafter scheduled for delivery by forward link scheduling logic.

At block 508, a determination is made as to whether there are more received packets to be processed. In an aspect, the CPU 302 makes this determination. If there are no more packets to be processed, the method stops at block 510. If there are more received packets to be processed, the method proceeds to block 512.

At block 512, the next received packet is selected as the current packet for processing. In an aspect, the CPU 302 selects the next packet received by the input buffer 306 that is associated with the destination AT as the current packet for processing.

At block 514, an average relative delay up to the destination RAN and a modified timestamp are determined for the current packet. In an aspect, the CPU 302 operates to perform the TSA 312 to determine the averaged relative delay and the modified timestamp for the current packet using information associated with one or more previous packets according to the timestamp algorithm described above. For example, an IIR filter is used to filter a delay associated with the current packet and the average relative delays of one or more previous packets to determine the averaged relative delay associated with the current packet. The CPU 302 then determines the modified timestamp for the current packet using the computed average relative delay.

At block 516, a determination is made as to whether the determined modified timestamp is out of range. For example, if the determined modified timestamp is greater than the current time, then the modified timestamp is considered to be out of range. In an aspect, the CPU 302 makes this determination. If the modified timestamp is out of range, the method proceeds to block 518. If the modified timestamp is not out of range, the method proceeds to block 506.

At block 518, the modified timestamp is set to a value equal to the current time minus a FLQD minimum. In an aspect, the CPU 302 performs this function. The method then proceeds to block 506.

Therefore, the method 500 operates to generate modified timestamps for received packets in accordance with aspects of a timing system. It should be noted that the method 500 is just one implementation and that the operations of the method 500 may be rearranged or otherwise modified within the scope of the various aspects. Thus, other implementations are possible with the scope of the various aspects described herein.

The various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium is coupled to the processor, such that the processor can read information from, and write information to, the storage medium. In the alternative, the storage medium may be integral to the processor. The processor and the storage medium may reside in an ASIC. The ASIC may reside in a wireless communication device. In the alternative, the processor and the storage medium may reside as discrete components in a wireless communication device.

The description of the disclosed aspects is provided to enable any person skilled in the art to make or use the present invention. Various modifications to these aspects may be readily apparent to those skilled in the art, and the generic principles defined herein may be applied to other aspects, e.g., in an instant messaging service or any general wireless data communication applications, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of a timing system have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for generating modified timestamps, the method comprising:
   receiving one or more packets associated with a selected destination;
   computing an average relative delay associated with each packet, wherein the average relative delay is based on a difference between a current time of arrival for a packet and a source timestamp for the packet, wherein the average relative delay for a non-first packet is further based on the difference and a delay of one or more previous packets in a same flow as the non-first packet, and wherein a first average relative delay ($BD_1$) for a first packet is computed according to the expression: $BD_1 = Arrival\_TS_1 - RTP\_TS_1$, wherein $Arrival\_TS_1$ is the current time of arrival for the first packet and $RTP\_TS_1$ is a real-time protocol timestamp for the first packet;
   determining a modified timestamp associated with each packet based on the average relative delay associated with each packet, wherein determining a modified timestamp for the non-first packet (n>=2) comprises adding the source timestamp for the non-first packet to the average relative delay for the non-first packet according to the expression: $Modified\_TS_n = RTP\_TS_n + BD_n$, wherein $Modified\_TS_n$ is a modified timestamp for an nth packet, $RTP\_TS_n$ is a real-time protocol timestamp for the nth packet and $BD_n$ is an average relative delay for the nth packet; and
   outputting the one or more packets and their associated modified timestamps.

2. The method of claim 1, wherein said determining comprises determining a first modified timestamp associated with a first packet to be equal to an arrival time of the first packet.

3. The method of claim 1, wherein said computing comprises filtering a delay associated with a selected packet and one or more average relative delays associated with one or more previous packets to compute an average relative delay associated with the selected packet.

4. The method of claim 3, wherein said filtering comprises filtering with an IIR filter.

5. The method of claim 1, further comprising:
   determining whether a selected modified time stamp associated with a selected packet is out of range; and
   setting the selected modified time stamp to be equal to a current time minus a forward link queuing delay minimum value, if it is determined that the selected modified time stamp is out of range.

6. An apparatus for generating modified timestamps, the apparatus comprising:
   a packet receiver configured to receive one or more packets associated with a selected destination; and
   processing logic configured to:
   compute an average relative delay associated with each packet, wherein the average relative delay is based on a difference between a current time of arrival for a packet and a source timestamp for the packet, wherein the average relative delay for a non-first packet is further based on the difference and a delay of one or more previous packets in a same flow as the non-first packet, and wherein a first average relative delay ($BD_1$) for a first packet is computed according to the expression: $BD_1 = Arrival\_TS_1 - RTP\_TS_1$, wherein $Arrival\_TS_1$ is the current time of arrival for the first packet and $RTP\_TS_1$ is a real-time protocol timestamp for the first packet;
   determine a modified timestamp associated with each packet based on the average relative delay associated with each packet, wherein the logic configured to determine a modified timestamp for the non-first packet (n>=2) comprises logic configured to add the source timestamp for the non-first packet to the average relative delay for the non-first packet according to the expression: $Modified\_TS_n = RTP\_TS_n + BD_n$, wherein $Modified\_TS_n$ is a modified timestamp for an nth packet, $RTP\_TS_n$ is a real-time protocol timestamp for the nth packet and $BD_n$ is an average relative delay for the nth packet; and
   output the one or more packets and their associated modified timestamps.

7. The apparatus of claim 6, wherein said processing logic is configured to determine a first modified timestamp associated with a first packet to be equal to an arrival time of the first packet.

8. The apparatus of claim 6, wherein said processing logic is configured to filter a delay associated with a selected packet and one or more average relative delays associated with one or more previous packets to compute an average relative delay associated with the selected packet.

9. The apparatus of claim 8, wherein said processing logic is configured to filter with an IIR filter.

10. The apparatus of claim 6, wherein said processing logic is configured to:
    determine whether a selected modified time stamp associated with a selected packet is out of range; and
    set the selected modified time stamp to be equal to a current time minus a forward link queuing delay minimum value, if it is determined that the selected modified time stamp is out of range.

11. An apparatus for generating modified timestamps, the apparatus comprising:
    means for receiving one or more packets associated with a selected destination;
    means for computing an average relative delay associated with each packet, wherein the average relative delay is based on a difference between a current time of arrival for a packet and a source timestamp for the packet, wherein the average relative delay for a non-first packet is further based on the difference and a delay of one or more previous packets in a same flow as the non-first packet, and wherein a first average relative delay ($BD_1$) for a first packet is computed according to the expression: $BD_1 = Arrival\_TS_1 - RTP\_TS_1$, wherein $Arrival\_TS_1$ is the current time of arrival for the first packet and $RTP\_TS_1$ is a real-time protocol timestamp for the first packet;

means for determining a modified timestamp associated with each packet based on the average relative delay associated with each packet, wherein the means for determining comprise means for determining a modified timestamp for the non-first packet (n>=2) by adding the source timestamp for the non-first packet to the average relative delay for the non-first packet according to the expression: $\text{Modified\_TS}_n = \text{RTP\_TS}_n + \text{BD}_n$ wherein $\text{Modified\_TS}_n$ is a modified timestamp for an nth packet, $\text{RTP\_TS}_n$ is a real-time protocol timestamp for the nth packet and $\text{BD}_n$ is an average relative delay for the nth packet; and means for outputting the one or more packets and their associated modified timestamps.

12. The apparatus of claim 11, wherein said means for determining comprises means for determining a first modified timestamp associated with a first packet to be equal to an arrival time of the first packet.

13. The apparatus of claim 11, wherein said means for computing comprises means for filtering a delay associated with a selected packet and one or more average relative delays associated with one or more previous packets to compute an average relative delay associated with the selected packet.

14. The apparatus of claim 13, wherein said means for filtering comprises means for filtering with an IIR filter.

15. The apparatus of claim 11, further comprising:
means for determining whether a selected modified time stamp associated with a selected packet is out of range; and
means for setting the selected modified time stamp to be equal to a current time minus a forward link queuing delay minimum value, if it is determined that the selected modified time stamp is out of range.

16. A computer program product for generating modified time stamps, the computer program product comprising:
a non-transitory machine-readable medium comprising:
a first set of codes for causing a computer to receive one or more packets associated with a selected destination;
a second set of codes for causing the computer to compute an average relative delay associated with each packet, wherein the average relative delay is based on a difference between a current time of arrival for a packet and a source timestamp for the packet, wherein the average relative delay for a non-first packet is further based on the difference and a delay of one or more previous packets in a same flow as the non-first packet, and wherein a first average relative delay ($\text{BD}_1$) for a first packet is computed according to the expression: $\text{BD}_1 = \text{Arrival\_TS}_1 - \text{RTP\_TS}_1$, wherein $\text{Arrival\_TS}_1$ is the current time of arrival for the first packet and $\text{RTP\_TS}_1$ is a real-time protocol timestamp for the first packet;
a third set of codes for causing the computer to determine a modified timestamp associated with each packet based on the average relative delay associated with each packet, wherein the third set of codes further causes the computer to determine a modified timestamp for the non-first packet (n>=2) by adding the source timestamp for the non-first packet to the average relative delay for the non-first packet according to the expression: $\text{Modified\_TS}_n = \text{RTP\_TS}_n + \text{BD}_n$, wherein $\text{Modified\_TS}_n$ is a modified timestamp for an nth packet, $\text{RTP\_TS}_n$ is a real-time protocol timestamp for the nth packet and $\text{BD}_n$ is an average relative delay for the nth packet; and
a fourth set of codes for causing the computer to output the one or more packets and their associated modified timestamps.

17. The machine-readable medium of claim 16, wherein said third set of codes is configured to cause the computer to determine a first modified timestamp associated with a first packet to be equal to an arrival time of the first packet.

18. The machine-readable medium of claim 16, wherein said second set of codes is configured to cause the computer to filter a delay associated with a selected packet and one or more average relative delays associated with one or more previous packets to compute an average relative delay associated with the selected packet.

19. The machine-readable medium of claim 18, wherein said second set of codes is configured to cause the computer to filter with an IIR filter.

20. The machine readable medium of claim 16, further comprising:
a fifth set of codes configured to cause the computer to determine whether a selected modified time stamp associated with a selected packet is out of range; and a sixth set of codes configured to cause the computer to set the selected modified time stamp to be equal to a current time minus a forward link queuing delay minimum value, if it is determined that the selected modified time stamp is out of range.

21. At least one integrated circuit configured to generate modified time stamps, the at least one integrated circuit comprising:
a first module configured to receive one or more packets associated with a selected destination;
a second module configured to compute an average relative delay associated with each packet, wherein the average relative delay is based on a difference between a current time of arrival for a packet and a source timestamp for the packet, wherein the average relative delay for a non-first packet is further based on the difference and a delay of one or more previous packets in a same flow as the non-first packet, and wherein a first average relative delay ($\text{BD}_1$) for a first packet is computed according to the expression: $\text{BD}_1 = \text{Arrival\_TS}_1 - \text{RTP\_TS}_1$, wherein $\text{Arrival\_TS}_1$ is the current time of arrival for the first packet and $\text{RTP\_TS}_1$ is a real-time protocol timestamp for the first packet;
a third module configured to determine a modified timestamp associated with each packet based on the average relative delay associated with each packet, wherein the third module is further configured to determine a modified timestamp for the non-first packet (n>=2) by adding the source timestamp for the non-first packet to the average relative delay for the non-first packet according to the expression: $\text{Modified\_TS}_n = \text{RTP\_TS}_n + \text{BD}_n$, wherein $\text{Modified\_TS}_n$ is a modified timestamp for an nth packet, $\text{RTP\_TS}_n$ is a real-time protocol timestamp for the nth packet and $\text{BD}_n$ is an average relative delay for the nth packet; and
an output buffer_configured to output the one or more packets and their associated modified timestamps.

22. The at least one integrated circuit of claim 21, wherein said third module is configured to determine a first modified timestamp associated with a first packet to be equal to an arrival time of the first packet.

23. The at least one integrated circuit of claim 21, wherein said second module is configured to filter a delay associated with a selected packet and one or more average relative delays associated with one or more previous packets to compute an average relative delay associated with the selected packet.

24. The at least one integrated circuit of claim 23, wherein said second module is configured to filter with an IIR filter.

25. The at least one integrated circuit of claim 21, further comprising:
- a fourth module configured to determine whether a selected modified time stamp associated with a selected packet is out of range; and
- a fifth module configured to set the selected modified time stamp to be equal to a current time minus a forward link queuing delay minimum value, if it is determined that the selected modified time stamp is out of range.

* * * * *